(12) United States Patent
Kang

(10) Patent No.: US 6,930,384 B2
(45) Date of Patent: Aug. 16, 2005

(54) TAPE CARRIER PACKAGE

(75) Inventor: Sin-Gu Kang, Suwon (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/831,340

(22) Filed: Apr. 26, 2004

(65) Prior Publication Data

US 2004/0262736 A1 Dec. 30, 2004

Related U.S. Application Data

(60) Continuation of application No. 10/395,232, filed on Mar. 25, 2003, now Pat. No. 6,727,577, which is a division of application No. 09/450,377, filed on Nov. 29, 1999, now Pat. No. 6,559,522.

(30) Foreign Application Priority Data

Nov. 27, 1998 (KR) ............................................. 98-51418

(51) Int. Cl.⁷ .............................................. H01L 23/12
(52) U.S. Cl. ...................................... 257/701; 257/692
(58) Field of Search ............................... 257/690, 692, 257/688, 701

(56) References Cited

U.S. PATENT DOCUMENTS

| | | | |
|---|---|---|---|
| 5,231,303 A | * | 7/1993 | Kasahara et al. ........... 257/669 |
| 5,614,760 A | | 3/1997 | Osono et al. |
| 6,084,291 A | | 7/2000 | Fuji |
| 6,320,691 B1 | * | 11/2001 | Ouchi et al. ............... 359/237 |
| 6,342,727 B1 | | 1/2002 | Fujimori |
| 6,380,620 B1 | | 4/2002 | Suminoe et al. |

* cited by examiner

Primary Examiner—Roy Potter
(74) Attorney, Agent, or Firm—McGuireWoods LLP

(57) ABSTRACT

Disclosed is a tape carrier package for electrically connecting LCD panel with source and gate driver PCBs and an LCD module to which the tape carrier package is applied. The tape carrier package includes: a first flexible film made of insulator; a conductive pattern formed on the first flexible film and having a plurality of input/output leads each having an input terminal and an output terminal; a semiconductor chip having a plurality of input/output terminals electrically connected with the input/output leads of the conductive pattern; and a second film made of insulator, the second film coating the conductive input/output leads such that the input/output leads are exposed by a selected length from respective ends thereof, wherein at least one selected lead of the input/output leads disposed at at least one sided end of the tape carrier package comprises a first portion and a second portion which is wider than the first portion, the second portion extending from a first selected position of the exposed leads to a second selected position of the second film passing over a boundary between the second film and the exposed leads.

27 Claims, 2 Drawing Sheets

TAPE CARRIER PACKAGE

CROSS REFERENCE

This application is a continuation application of Applicant's U.S. patent application Ser. No. 10/395,232 filed on Mar. 25, 2003, now U.S. Pat. No. 6,727,577 which is a divisional application of U.S. patent application Ser. No. 09/450,377 filed on Nov. 29, 1999 now U.S. Pat. No. 6,559,522.

BACKGROUND OF THE INVENTION

1. Field of the Invention

The present invention relates to a tape carrier package, and more particularly to a foldable tape carrier package which electrically connects an LCD panel with an LCD driver printed circuit board. Further, the invention relates to an LCD module to which the tape carrier package is applied.

2. Description of the Related Art

In thin film transistor liquid crystal display (TFT-LCD), gate driver printed circuit board (PCB) that drives gate lines and source driver PCB that drives source lines are respectively disposed apart by a selected distance from long and short edges of LCD panel.

Tape carrier packages (hereinafter referred to as "TCP") are used for electrically gate and source driver PCBs with LCD panel apart from the PCBs.

TCP is a kind of packages wherein input and output lines, that is, leads are printed on a flexible insulating base film and a chip that is connected with the leads is mounted on the base film. The leads are covered with a resist film except for a selected portion from the both ends.

When gate and source driver PCBs that are connected with the TCP are placed on the same plane with the LCD panel in the LCD module product, the module size becomes larger unnecessarily compared with the display region of the LCD module. Accordingly, it has been provided that such the PCBs are attached to the backside of the LCD panel using the flexibility of the TCP.

Fukuta et al (U.S. Pat. No. 5,153,705, TAB PACKAGE AND A LIQUID-CRYSTAL PANEL UNIT USING THE SAME, Oct. 6, 1992) discusses a TCP in which slit is formed at a bending portion of the TCP in order to prevent leads from being broken when a large stress is concentrated on the bending portion.

As the number of leads increases due to the request of high definition in image quality and of decrease in fabrication costs, pitch between leads decreases. Decrease in pitch enhances the stress per unit area applied to the boundary between a first portion where the resist film is coated and a second portion where the resist film is not coated. As a result, in spite of the existence of the slit, a progressive crack frequently occurs at the boundary.

SUMMARY OF THE INVENTION

It is therefore an object of the present invention to provide a TCP having fine pitch leads and being endurable in the stress concentrated during the bending of the TCP.

It is another object of the present invention to an LCD to which a TCP having fine pitch leads and being endurable in the stress concentrated during the bending of the TCP is applied.

To achieve the above objects and other advantages, there is provided a tape carrier package comprising: a first flexible film made of insulator; a conductive pattern formed on the first flexible film and having a plurality of input/output leads each having an input terminal and an output terminal; a semiconductor chip having a plurality of input/output terminals electrically connected with the input/output leads of the conductive pattern; and a second film made of insulator, the second film coating the conductive input/output leads such that the input/output leads are exposed by a selected length from respective ends thereof, wherein at least one selected lead of the input/output leads disposed at at least one sided end of the tape carrier package comprises a first portion and a second portion which is wider than the first portion, the second portion extending from a first selected position of the exposed leads to a second selected position of the second film passing a boundary between the second film and the exposed leads.

According to another aspect of the present invention, there is provided a tape carrier package comprising: a first flexible film made of insulator; a conductive pattern formed on the first flexible film and having a plurality of input/output leads each having an input terminal and an output terminal; a semiconductor chip having a plurality of input/output terminals electrically connected with the input/output leads of the conductive pattern; and a second film made of insulator, the second film coating the conductive input/output leads such that the input/output leads are exposed by a selected length from respective ends thereof, wherein said output leads of the conductive pattern has at least three selected output leads disposed at at least one sided edge of the tape carrier package. Here, the selected output leads includes: (a) a first output lead including a first portion and a second portion which is wider than the first portion, the second portion extending from a first selected position of the exposed leads to a second selected position of the second film passing over a boundary between the second film and the exposed leads; and (b) a second output lead including at least two lead wires which input/output the same signal, said two lead wires combining as one body from a third selected position of the exposed leads to a fourth selected position of the second film passing over a boundary between the second film and the exposed leads, and said combining two lead wires being wider than the first portion of the first output lead.

According to yet another aspect of the present invention, the above described two TCPs are applied to LCD modules in which LCD panel and gate and source driver PCBs are electrically connected with each other.

BRIEF DESCRIPTION OF THE DRAWINGS

The above object and other advantages of the present invention will become more apparent by describing in detail the preferred embodiments thereof with reference to the accompanying drawings, in which.

DETAILED DESCRIPTION OF THE PREFERRED EMBODIMENTS

The present invention now will be described more fully hereinafter with reference to the accompanying drawings, in which preferred embodiments of the invention are shown.

This invention may, however, be embodied in many different forms and should not be construed as limited to the embodiments set forth herein; rather, these embodiments are provided so that this disclosure will be thorough and complete, and will fully convey the scope of the invention to those having skill in the art.

Figure 1:
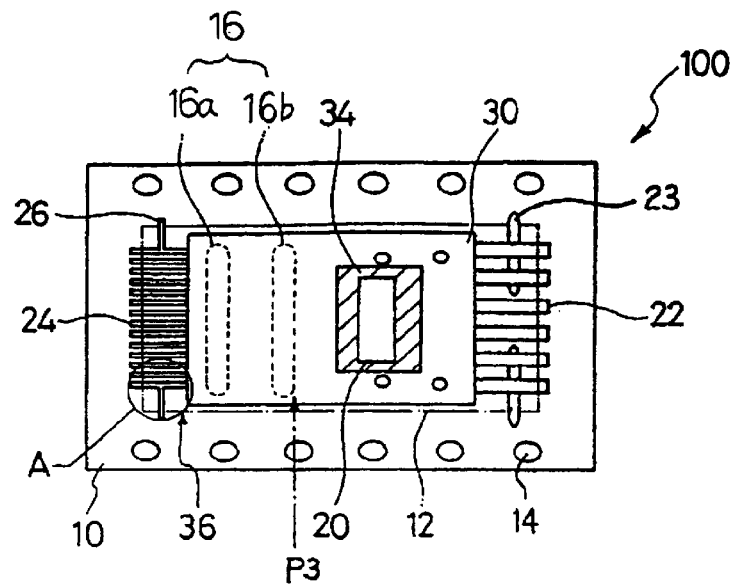
FIG. 1 is a simplified plan view of a TCP having slits according to one embodiment of the present invention.

FIG. 1 is a plan view of a TCP in which multiple slits, for example, two slits are formed at the bending portion of the TCP.

Referring to FIG. 1, there is provided a base film 10 (or first insulating film) that is thin like tape, is made of insulator, and has a flexibility. At both edge portions along the length direction of the base film 10, a plurality of through holes are formed and are fixed to a lower die during the fabrication processes of TCP.

On a selected portion of outer surface (or first surface) of the base film 10, a semiconductor chip (or die) 20 having multiple input and output terminals is mounted. A conductive pattern including input leads 22 and output leads 24 is attached to the inner surface of the base film 10.

In FIG. 1, the input terminals of the semiconductor chip 20 are electrically bonded to one-sided terminals of the input leads 22 that are attached to the inner surface of the base film 10 through a square through hole formed at a selected portion of the base film 10 from the outer surface of the base film 10 and the output terminals of the semiconductor chip 20 are electrically bonded to the other sided terminals of the output leads 24 of the conductive pattern.

Semiconductor chip 20, input and output terminals of the semiconductor chip 20 are coated with a molding compound 34 such as solder resist. Also, the input and output leads 22 and 24 of the TCP 100 are coated with solder resist (or second insulating film) 30 except a portion corresponding to a selected length from both ends of the TCP 100.

The input and output leads 22 and 24 of the TCP 100 include alignment marks 23 and 26 which allow the input and output leads 22 and 24 to be aligned with interconnection lines of LCD panel and gate and source drive PCBs during the bonding process between the input and output leads 22 and 24 and interconnection lines of LCD panel and gate and source drive PCBs.

In the fabrication process of TCP 100, after the semiconductor chip 20 is mounted on the base film 10, the outer edge portions of the base film 10 including the through holes 14 should be removed. In FIG. 1, reference numeral 12 is cut lines for removing the outer edge portions of the base film 10.

Figure 3:
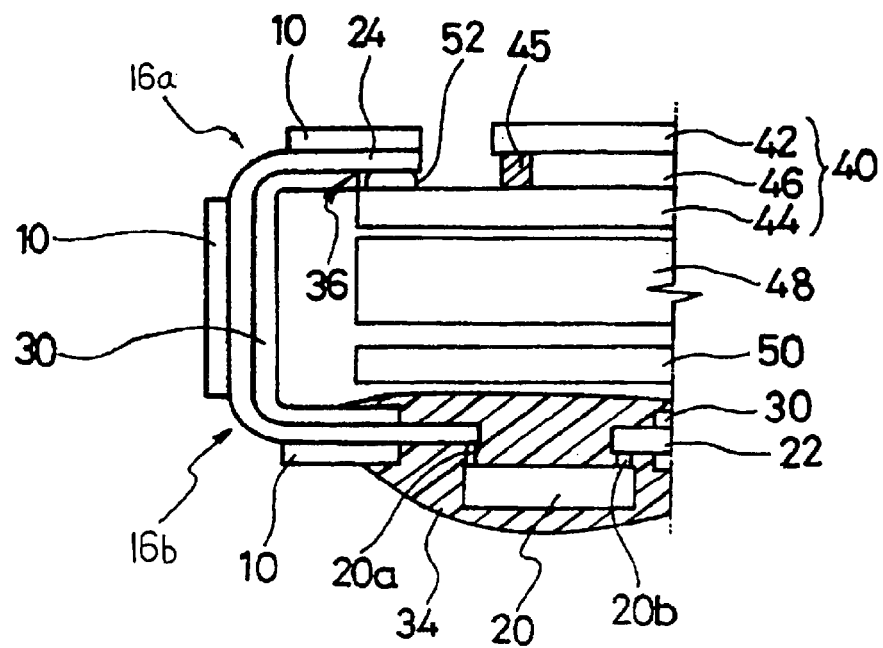
FIG. 3 a partial sectional view showing that the TCP of FIG. 2 is mounted on the LCD module.

When TCP 100 having the above-described constitution is used for electrically connecting LCD panel with driver PCBs, exposed leads of the input terminal (hereinafter referred to as input outer leads) 22 are bonded to the interconnection lines of a driver PCB 50 and exposed leads of the output terminal (hereinafter referred to as output outer leads) 24 are bonded to the interconnection lines of LCD panel as shown in FIG. 3.

As one way for decreasing LCD panel size, driver PCB is placed at the backside of the LCD panel. For such the arrangement, TCP 100 should be bent at a selected portion between the output outer leads 24 and the semiconductor chip 20 through the width direction of the base film 10.

When the TCP 100 is bent, a stress is concentrated on the bent portion. To reduce the stress, as shown in FIGS. 1 and 3, at least one, for example, two slits 16 are selectively formed along the width direction of the base film 10. In FIG. 1, the dotted line is meant by the slits 16 being formed only at the base film 10.

Then, as the number of the output outer leads 24 increases and the output outer leads 24 come to have fine pitch, higher stress is concentrated on the boundary 36 between the solder resist 30 and the output outer leads 24. The higher stress generates crack at the output outer leads 24 of the boundary 36 and the generated crack may be propagated with high possibility.

Figure 2:
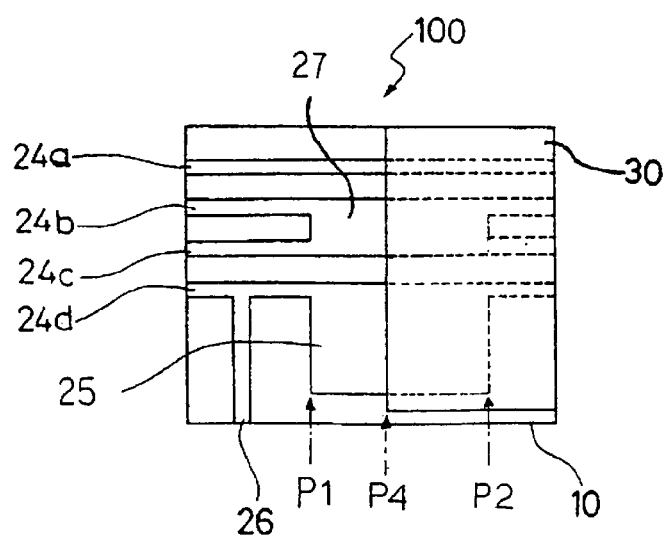
FIG. 2 is a detailed view of portion "A" in FIG. 1.

FIG. 2 is a detail view of portion A of FIG. 1 and shows a constitution of TCP which is designed to endure an increasing stress when, as the output outer leads come to have fine pitch, a stress that is concentrated on the boundary 36 between the solder resist 30 and the output outer leads 24 increases.

Referring to FIG. 2, the leftmost outer lead (or first outer leads) of the output outer leads 24 includes a second portion 25 that is wider than the remaining leads from a first selected position P1 of the exposed portion to a second selected portion P2 passing the boundary P4 with the solder resist 30.

The second portion 25 of the first outer lead 24d disperses the stress which is concentrated on the outer leads placed at the boundary P4 with the solder resist 30 and is transferred into respective outer leads 24 through the solder resist 30 during the bending of the TCP 100. As a result, the possibility which the crack is generated at the outer leads decreases.

Here, the second portion 25 of the first outer lead 24d is disposed at a margin space of the base film 10. And, the first selected position P1 should be determined sufficiently considering an arrangement with the alignment mark 26. In other words, when the first selected position P1 is very adjacent to the alignment mark 26 of the output outer leads 24, the first selected position P1 of the second portion 25 of the first outer lead 24d is erroneously regarded as the alignment position and whereby misalignment may occur.

Meanwhile, the second selected position P2 of the first outer lead 24d, as shown in FIG. 1, may be the right sided boundary line P3 of the second slit 16b that is more adjacent to the semiconductor chip 20 than the first slit 16a, and it can selectively extend to the output terminal of the semiconductor chip 20. This is to disperse the stress concentrated on these slits 16a and 16b when the slits 16a and 16b are formed in the TCP 100.

Also, selectively, the second portion 25 of the first outer lead 24d, as shown in FIG. 2, can be formed only at one side of the output outer leads or at both sides of the output outer lead.

Moreover, the first outer lead 24d can be disposed not only at the output outer lead but at the input outer lead.

As another embodiments of the present invention, these patterns for the outer leads can be modified in various shapes. For example, like the lead 27 placed at the middle, a structure in which two leads (or second outer lead and third outer lead) 24b, 24c are connected to each other at a selected portion can be used. Here, such the two outer leads connected structure can be applied to multiple bypass leads into which Vcom is input or to multiple dummy leads.

Like case of the first outer lead 24d, the first selected position P1 where the connection starts and the second selected position P2 where the connection ends can be also modified.

For example, the first selected position P1 of the second and third outer leads 24b and 24c of the second and third outer loads 24b and 24c is apart by a selected distance from the one sided end line P4 of the solder resist 30. Selectively, it is desirous that the first selected position of the second and third outer leads 24b and 24c is designed to be the same with the first selected position P1 of the first outer lead 24d.

Also, the second selected position of the second and third outer leads 24b and 24c, like the second selected position P2 of the first outer lead 24d, may be the right sided boundary line which is more adjacent to the semiconductor chip 20 among the two slits 16a and 16b of FIG. 1 and it can selectively extend to the output terminal of the semiconductor chip 20.

Selectively, the connected portion 27 of the second and third outer leads 24b and 24c, as shown in FIG. 2, can be formed only at one side of the output outer leads, or at both sides of the output outer leads.

In addition, the second and third outer leads 24b and 24c can be disposed not only at the output outer leads but at the input outer leads.

In the above construction, it is also preferable that the area of the connected portion 27 of the second and third outer leads 24b and 24c is designed to be smaller than the area of the second portion 25 of the first outer lead 24d.

According to the above embodiment, although the crack is generated at any one of the second or third outer lead 24b or 24c except for the connected portion 27, it can be prevented that signal transmission from the output terminals of the semiconductor chip to the interconnection wires of LCD panel fails.

FIG. 3 is a partial sectional view showing a connection between LCD module, and driver PCB using the TCP of FIG. 2.

Referring to FIG. 3, there is provided an LCD panel 40 which includes an upper glass substrate 42 having color filters formed on inner surface thereof, a lower glass substrate 44 having thin film transistors formed on inner surface thereof, and liquid crystal interposed between the upper and lower glass substrates.

The lower glass substrate is greater than the upper glass substrate in size. Therefore, in the LCD panel 40 to which the two glass substrates are attached, two edge portions of the lower glass substrate are exposed to the outside. A plurality of interconnection lines (or wires) are formed on the exposed edge portions of the lower glass substrate.

Below the LCD panel 40, there is disposed a mold frame 48 including a backlight assembly for irradiating light beams toward the LCD panel 40. The gate and source driver PCBs are disposed at the backside of the mold frame 48.

The TCP 100 of FIG. 2 is used for interconnecting the wires of the LCD panel 40 and the wires of the driver PCBs.

One ends of the output outer leads 24 of the TCP 100 are bonded to the wires formed at the exposed portion of the lower glass substrate 44 by automated carrier film (ACF) and the other ends are bonded to the output terminals 20a of the semiconductor chip 20.

One ends of the input outer leads 22 of the TCP 100 are bonded to the wires of the driver PCB 50 and the other ends are bonded to the input terminals 20b of the semiconductor chip 20.

When the bonding is performed as shown in FIG. 3, high stress is concentrated on two portions of the TCP 100. The pair of slits 16a and 16b are disposed at the base film 10 of the two stress concentrated portions along the width direction of the base film 10.

Modifications described in previous embodiment in relation to the TCP 10 are also applied to the TCP of FIG. 3. Therefore, the stress concentrated on the boundary 36 between the solder resist 30 and the output outer leads 24 is dispersed into the second portion 25 of the first outer lead 24d of FIG. 2 or the connected portion 27 of the second and third outer leads 24b and 24c, resulting in preventing crack from being generated.

Meanwhile, although the present embodiments describe that the TCP has at least two slits, the present invention can be applied to a TCP that does not have a slit. Moreover, although the present embodiments show and describe that such the TCP is applied to LCDs, it can be of course, applied to another flat panel displays such as plasma display panel (PDP) etc.

As described previously, the TCP of the present invention includes at least one outer lead disposed at an outer edge of the input and output outer leads and which an adjacent portion including the boundary between the solder resist and the outer lead is wider than the remaining portion of the outer lead. The at least one outer lead prevents crack from being generated at the outer lead. As a result, life cycle of the TCP is lengthened.

Moreover, by applying the TCP of the present invention to LCDs, failures of LCDs due to the outer lead crack of TCPs are substantially decreased.

This invention has been described above with reference to the aforementioned embodiments. It is evident, however, that many alternative modifications and variations will be apparent to those having skill in the art in light of the foregoing description. Accordingly, the present invention embraces all such alternative modifications and variations as fall within the spirit and scope of the appended claims.

What is claimed is:

1. A tape carrier package, comprising:
   a first flexible film;
   a conductive pattern formed on the first flexible film, the conductive pattern having an input lead and an output lead;
   a semiconductor chip having an input terminal and an output terminal coupled with the input lead and the output lead; and
   a second film coating the input lead and the output lead, wherein the input lead and the output lead are exposed by a certain length from respective ends thereof,
   wherein at least one selected lead of the input lead and the output lead disposed on an end of the tape carrier package comprises a first portion, and a second portion that is wider than the first portion, the second portion extending from a first selected position of the exposed leads to a second selected position of the first film passing beyond a boundary between the second film and the exposed leads.

2. The tape carrier package of claim 1, further comprising an alignment mark that allows the input lead and the output lead to be aligned with interconnection lines of a liquid crystal display panel.

3. The tape carrier package of claim 2, wherein the alignment mark is extended from an outmost input lead along a width direction of the first flexible film.

4. The tape carrier package of claim 2, wherein the alignment mark is made of an insulator on the first flexible film, and crosses the output leads along a width direction of the first flexible film.

5. A tape carrier package, comprising:
   a first flexible film including a cut line to remove outer edge portion of the first flexible film;
   a conductive pattern formed on the first flexible film, the conductive pattern having a plurality of input/output leads each having an input terminal and an output terminal, the conductive pattern crossing the cut line;

a semiconductor chip having a plurality of input/output terminals electrically connected to the input/output leads of the conductive pattern; and a second film made of insulator, the second film coating the conductive input/output leads such that the input/output leads are exposed by a selected length from respective ends thereof, wherein at least one selected lead of the input/output leads disposed adjacent to the cut line of the tape carrier package comprises a first portion, and a second portion that is wider than the first portion, the second portion extending from a first selected position of the exposed leads to a second selected position of the second film passing over a boundary between the second film and the exposed leads.

6. The tape carrier package of claim 5, wherein another two selected leads of the input/output leads that input/output the same signal are combined as one body from a third selected position of the exposed leads to a fourth selected position of the second film passing over a boundary between the second film and the exposed leads, and the combined two lead wires is wider than the first portion.

7. The tape carrier package of claim 5, further comprising an alignment mark that allows the input and output leads to be aligned with interconnection lines of a liquid crystal display panel.

8. The tape carrier package of claim 7, wherein the alignment mark is extended from am outmost input lead along a width direction of the first flexible film.

9. The tape carrier package of claim 7, wherein the alignment mark is made of insulator on the first flexible film, and crosses the output leads along a width direction of the first flexible film.

10. The tape carrier package of claim 5, wherein the first flexible film further comprises a plurality of through holes at both edge portions along a length direction of the first flexible film.

11. The tape carrier package of claim 5, wherein the first flexible film comprises at least two slits formed at a selected portion of the second film, for partially exposing the conductive pattern and the first flexible film.

12. The tape carrier package of claim 11, wherein the second selected position extends at least to one of the slits.

13. The tape carrier package of claim 11, wherein the second selected position extends at least to the output terminal of the semiconductor chip.

14. The tape carrier package of claim 5, wherein the one selected lead is one of two outermost output leads.

15. The tape carrier package of claim 5, wherein the second portion is disposed at a margin space of the first film.

16. A tape carrier package, comprising:

a first flexible film including a cut line to remove outer edge portions of the first flexible film;

a conductive pattern formed on the first flexible film, the conductive pattern having an input lead and an output lead, the conductive pattern crossing the cut line;

a semiconductor chip having an input terminal and an output terminal coupled with the input lead and the output lead; and a second film coating the input lead and the output lead, wherein the input lead and the output lead are exposed by a certain length from respective ends thereof, wherein at least one selected lead of the input lead and the output lead disposed adjacent to the cut line of the tape carrier package comprises a first portion, and a second portion that is wider than the first portion, the second portion extending from a first selected position of the exposed leads to a second selected position of the first flexible film passing beyond a boundary between the second film and the exposed leads.

17. The tape carrier package of claim 16, wherein another two selected leads that input and output the same signal are combined as one body from a third selected position of the exposed leads to a fourth selected position of the second film passing over a boundary between the second film and the exposed leads, and the combined two lead wired is wider than the first portion.

18. The tape carrier package of claim 16, further comprising an alignment mark that allows the input and output leads to be aligned with interconnection lines of a liquid crystal display panel.

19. The tape carrier package of claim 18, wherein the alignment mark is extended from an outermost input lead along a width direction of the first flexible film.

20. The tape carrier package of claim 18, wherein the alignment mark is made of insulator on the first flexible film, and crosses the output leads along a width direction of the first flexible film.

21. The tape carrier package of claim 16, wherein the first flexible film further comprises a plurality of through holes at both edge portions along a length direction of the first flexible film.

22. The tape carrier package of claim 16, further comprising a conductive layer outside of the selected lead of the input lead and the output lead disposed adjacent to the cut line of the tape carrier package.

23. The tape carrier package of claim 16, wherein the second portion is separated from the first portion.

24. The tape carrier package of claim 16, wherein the first flexible film comprises at least two slits, partially exposing the conductive pattern and the second film.

25. The tape carrier package of claim 24, wherein the second selected position extends at least to one of the slits.

26. The tape carrier package of claim 24, wherein the second selected position extends at least to the output terminal of the semiconductor chip.

27. The tape carrier package of claim 16, wherein the selected lead of the input lead and the output lead is one of two outermost output leads.

* * * * *